(12) United States Patent
Roux

(10) Patent No.: US 6,770,895 B2
(45) Date of Patent: Aug. 3, 2004

(54) METHOD AND APPARATUS FOR ISOLATING LIGHT SOURCE GAS FROM MAIN CHAMBER GAS IN A LITHOGRAPHY TOOL

(75) Inventor: Stephen Roux, New Fairfield, CT (US)

(73) Assignee: ASML Holding N.V. (NL)

(*) Notice: Subject to any disclaimer, the term of this patent is extended or adjusted under 35 U.S.C. 154(b) by 30 days.

(21) Appl. No.: 10/300,898

(22) Filed: Nov. 21, 2002

(65) Prior Publication Data
US 2004/0099816 A1 May 27, 2004

(51) Int. Cl.[7] ................................................. F01J 61/00
(52) U.S. Cl. ................. 250/492.2; 250/504; 250/491.1; 250/493.3
(58) Field of Search ............................ 250/504, 504 R, 250/492.2, 493.1, 492.1; 313/570, 637, 638, 640, 641, 642, 231.31, 231.61; 362/263

(56) References Cited

U.S. PATENT DOCUMENTS

| | | | | |
|---|---|---|---|---|
| 6,341,006 B1 | * | 1/2002 | Murayama et al. | ........... 355/53 |
| 6,493,423 B1 | * | 12/2002 | Bisschops | ................... 378/119 |
| 6,566,667 B1 | * | 5/2003 | Partlo et al. | ............ 250/504 R |
| 2001/0004104 A1 | * | 6/2001 | Bijkerk et al. | ........... 250/492.2 |
| 2002/0014598 A1 | * | 2/2002 | Melnychuk et al. | ..... 250/504 R |
| 2002/0084428 A1 | * | 7/2002 | Visser et al. | ............. 250/492.2 |

* cited by examiner

Primary Examiner—John Lee
Assistant Examiner—James P. Hughes
(74) Attorney, Agent, or Firm—Sterne Kessler Goldstein & Fox, PLLC

(57) ABSTRACT

A system and method are used to isolate a first gas from a second gas using a third gas. A first chamber includes an element that emits light based on a first gas. A second chamber uses the emitted light to perform a process and includes the second gas. A gaslock that couples the first chamber to the second chamber. A gas source supplies a third gas between the first and the second gas in the gaslock, such that the first gas is isolated from the second gas in the gaslock. The first and third gas can be pumped from the first chamber and separated from one another, such that the first gas can be recycled for reuse to form the emitting light.

26 Claims, 4 Drawing Sheets

METHOD AND APPARATUS FOR ISOLATING LIGHT SOURCE GAS FROM MAIN CHAMBER GAS IN A LITHOGRAPHY TOOL

BACKGROUND OF THE INVENTION

1. Field of the Invention

The present invention relates generally to lithography systems. More particularly, the present invention relates to recycling light source gas in a lithography tool.

2. Background Art

Lithography is a process used to create features (e.g., devices) on a surface of one or more substrates (e.g., semiconductor wafers, or the like). Substrates can include those used in the manufacture of flat panel displays, circuit boards, various integrated circuits, and the like. During lithography, the substrate is positioned on a substrate stage and is exposed to an image projected onto the surface of the substrate. The image is formed by an exposure system. The exposure system includes a light source, optics, and a reticle (e.g., a mask) having a pattern used to form the image. The reticle is generally located between the light source and the substrate. In extreme ultraviolet (EUV) or electron beam systems, the light source is housed in a light source vacuum chamber and the exposure system and substrate are housed in an optics vacuum chamber. The light source chamber and the optical chamber can be coupled via a gaslock.

In a lithography, feature (e.g., device) size is based on a wavelength of the light source. To produce integrated circuits with a relatively high density of devices, which allows for higher operating speeds, it is desirable to image relatively small features. To produce these small features, a light source is needed that emits short wavelengths of light (e.g., around 13 nm). This radiation is called EUV light, which is produced by plasma sources, discharge sources, sycnchrotron radiation from electron storage rings, or the like.

In some systems, EUV light is created by utilizing a discharge plasma light source. This type of light source uses a gas or target material which is ionized to create the plasma. For example, the plasma-based light source can use a gas such as xenon. Then, the plasma is formed by an electrical discharge. Typically, the EUV radiation can be in the range of 13–14 nm. In other systems, EUV radiation is produced from laser produced plasma sources. In the laser produced plasma source, a jet of material (e.g., xenon, clustered xenon, water droplets, ice particles, lithium, tin vapor, etc.) can be ejected from a nozzle. A laser is spaced from the nozzle and emits a pulse that irradiates the jet to create the plasma. This plasma subsequently emits EUV radiation.

In order to produce a relatively large amount EUV light, a concentration of xenon must be relatively high where the plasma is being created (e.g., in the light source chamber). This produces a pressure that is too high for efficient transmission of the EUV light through the remainder of the system (e.g., the optics chamber). As a result, the path in which the EUV light travels must be evacuated. Usually, large vacuum pumps are used to remove the source gas as quickly as possible after it has performed its function of creating the EUV light. Unfortunately, at high machine throughput, a relatively large amount of source gas is pumped away. The cost of source gas such as xenon is substantial, and will result in a higher per wafer cost unless the source gas is recycled. Recycling the source gas is complicated by the inclusion of other gases being emitted from the remainder of the EUV lithography tool that mix with the source gas.

Accordingly, in some lithography tools the source gas is kept separate from gases in the remainder of the lithography tool by a very thin membrane. The membrane also removes unwanted radiation by functioning as a spectral filter. However, lithography tools having high throughput and high light intensity may not be able to have the membrane due to high thermal loading, which destroys the membrane. Thermal calculations show that the membrane would have to have a very large surface area to avoid vaporizing when the light source is turned on. A large surface, extremely thin membrane cannot be used in practice, even if they could be manufactured, due to their fragile nature. If the membrane is removed, a barrier between the source chamber and the rest of the tool is gone and gas mixing occurs, making the source gas recycling task extremely challenging, and in some cases completely impractical.

Therefore, what is needed is a method and apparatus of isolating gas in a light source chamber from gases being emitted from the remainder of a lithography tool to allow the gas in the source chamber to be efficiently recycled.

BRIEF SUMMARY OF THE INVENTION

An embodiment of the present invention provides a system including a first chamber including an element that emits light based on a first gas and a second chamber that uses the emitted light to perform a process and that includes a second gas. The system also includes a gaslock that couples the first chamber to the second chamber. The system further includes a gas source that supplies a third gas between the first and the second gas in the gaslock, such that the first gas is isolated from the second gas by the gaslock.

Another embodiment of the present invention provides a system, including a light source chamber having a first gas, an optics chamber having a second gas, a first means for coupling the light source chamber to the optics chamber, and a second means for passing a third gas through the first means to isolate the first gas from the second gas.

A further embodiment of the present invention provides a method including (a) producing light with a first gas, (b) processing optics with a second gas, and (c) separating the first gas from the second gas with a third gas that flows between them.

In one aspect of the embodiment, the first and third gas are pumped from the first chamber, the first gas is separated from the third gas, such that the first gas can be recycled for reuse.

Further embodiments, features, and advantages of the present inventions, as well as the structure and operation of the various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

Figure 1:
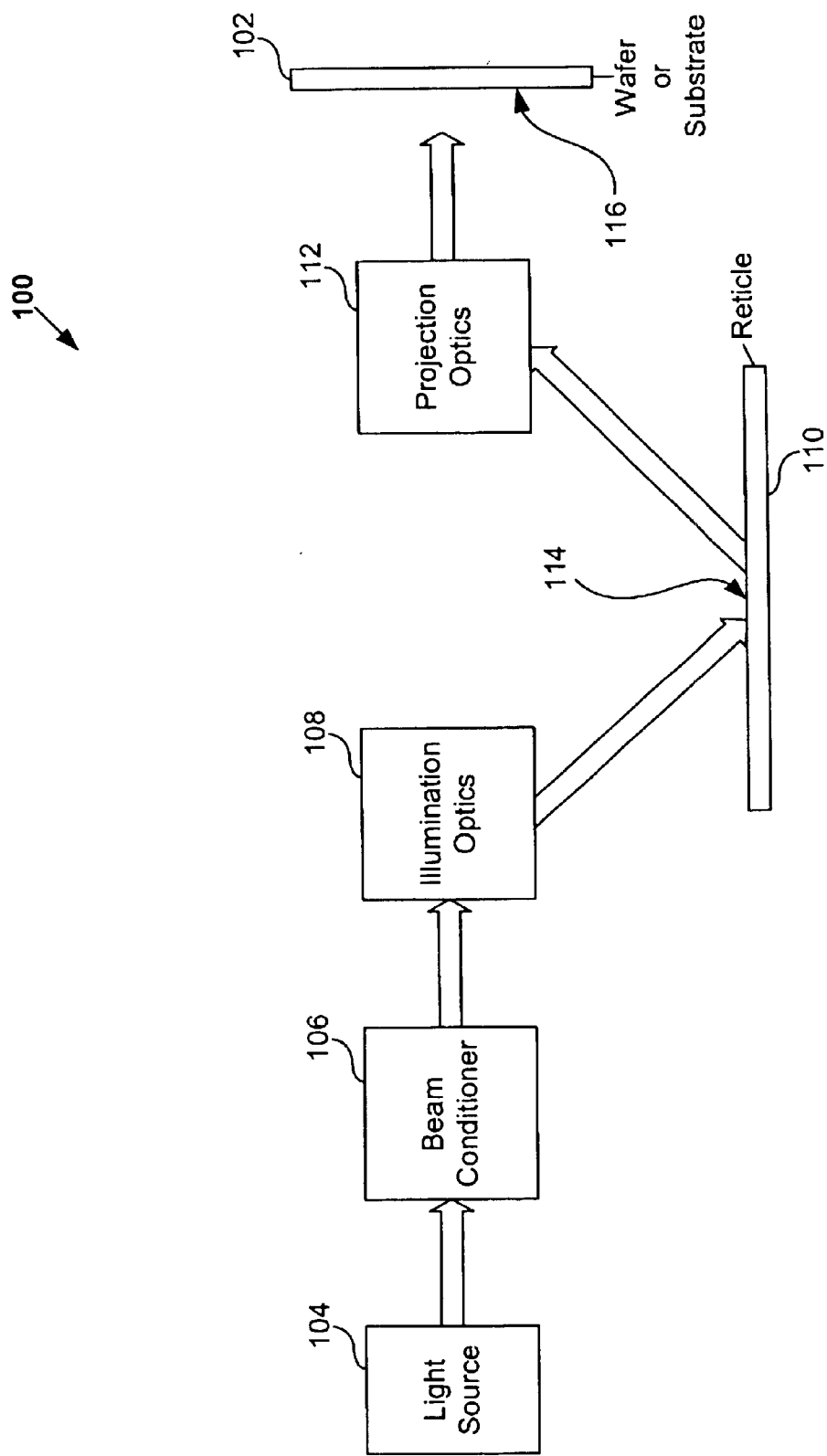
FIG. 1 shows a lithographic system, according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 show a system 100 for forming a pattern on a wafer or substrate 102 according to embodiments of the present invention. A light source 104 (e.g., an EUV light source) emits a light beam that passes through a beam conditioner 106 and illumination optics 108 before being reflected from a reticle or mask 110.

After reflecting from reticle or mask 110, the light beam passes through projection optics 112, which is used to transfer a pattern from a surface 114 of reticle or mask 110 onto a surface 116 of wafer or substrate 102. Other arrangements of these elements can be used without departing from the spirit and scope of the present invention.

Figure 2:
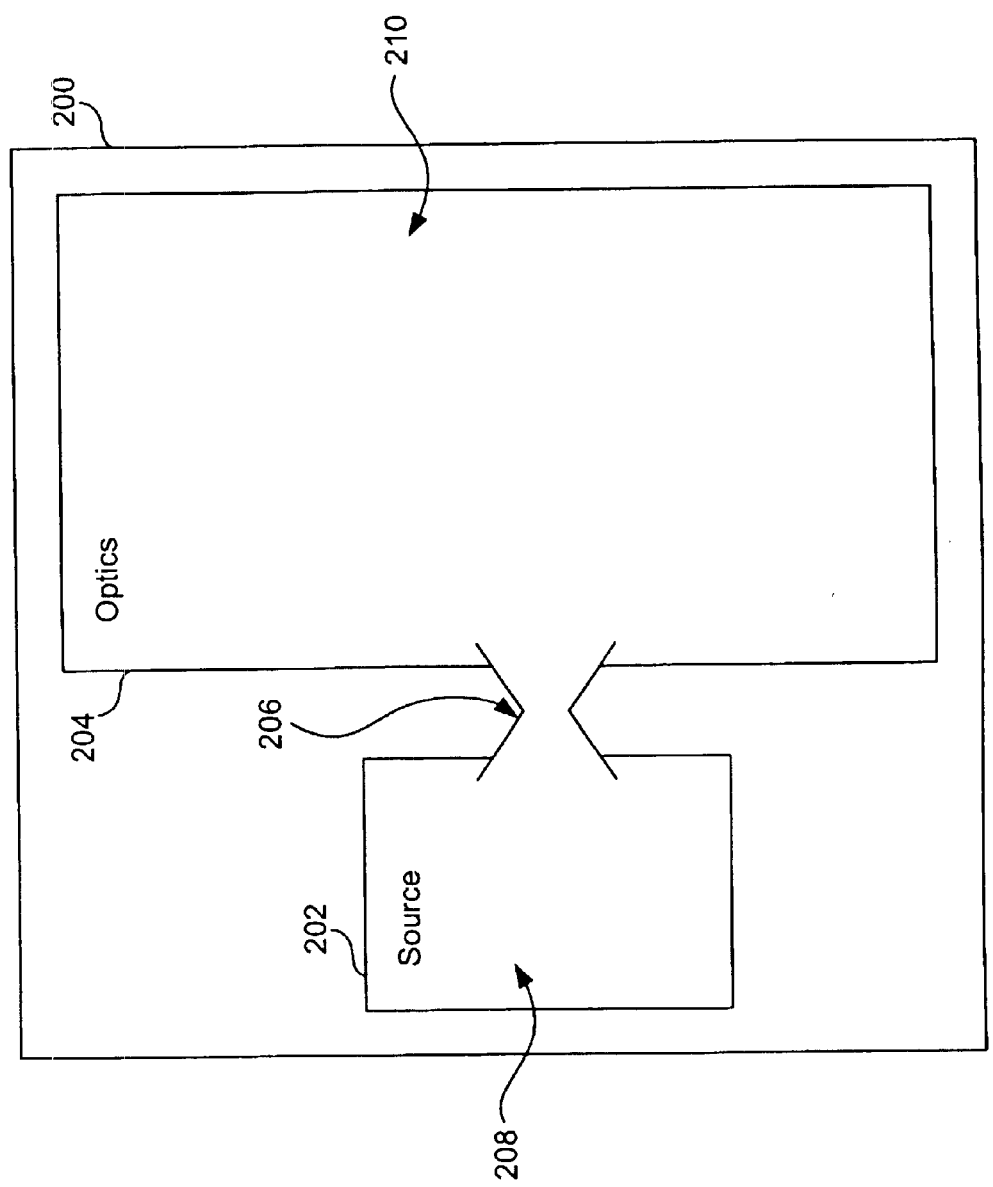
FIG. 2 shows a lithographic system, according to embodiments of the present invention.

FIG. 2 shows details of an exemplary system 200 according to an embodiment of the present invention. System 200 includes a first chamber (e.g., a light source chamber or vacuum light source chamber) 202 and second chamber (e.g., an optics chamber or optics vacuum chamber) 204. Second chamber 204 can include one or more of: a beam conditioner, illumination optics, a reticle, projection optics, and/or a wafer. First chamber 202 and second chamber 204 can be coupled via a gaslock 206. Basically, a gaslock is an area that allows first and second gases to remain isolated from one another based on a third gas flowing between them (e.g., forming a barrier between them), which suppresses: mixing of the first and second gas or transfer of material from first chamber 202 to second chamber 204, or vice versa.

When a plasma-based light source is housed in first chamber 202, a first gas or other material 208 (e.g., xenon, lithium vapor, tin, krypton, water vapor, a metal target, or the like) is ionized to create the plasma, as discussed above. First gas 208 is only supplied to first chamber 202 during a time when light is being generated. At other times (e.g., during stand-by, idle, maintenance, or other modes), first chamber 202 is substantially in a vacuum state. Second chamber 204 includes a second gas (e.g., a process gases, such as helium, argon, hydrogen, nitrogen, or the like) 210. Second gas 210 can be used to reduce contamination in second chamber 204 and protect lithography tool mirrors located in second chamber 204. Similarly to first gas 208, second gas 210 is only supplied to second chamber 204 during a time when cleaning or protection is required. At other times, second chamber 204 is substantially in a vacuum state. A vacuum state is needed in chambers 202 and 204 to allow EUV light to be transmitted because EUV light has a substantially short wavelength (e.g., 13–14 nm), so it cannot readily pass through any gas, which usually absorbs it. Thus, a vacuum state allows this wavelength of light to easily travel to and through second chamber 204.

Figure 3:
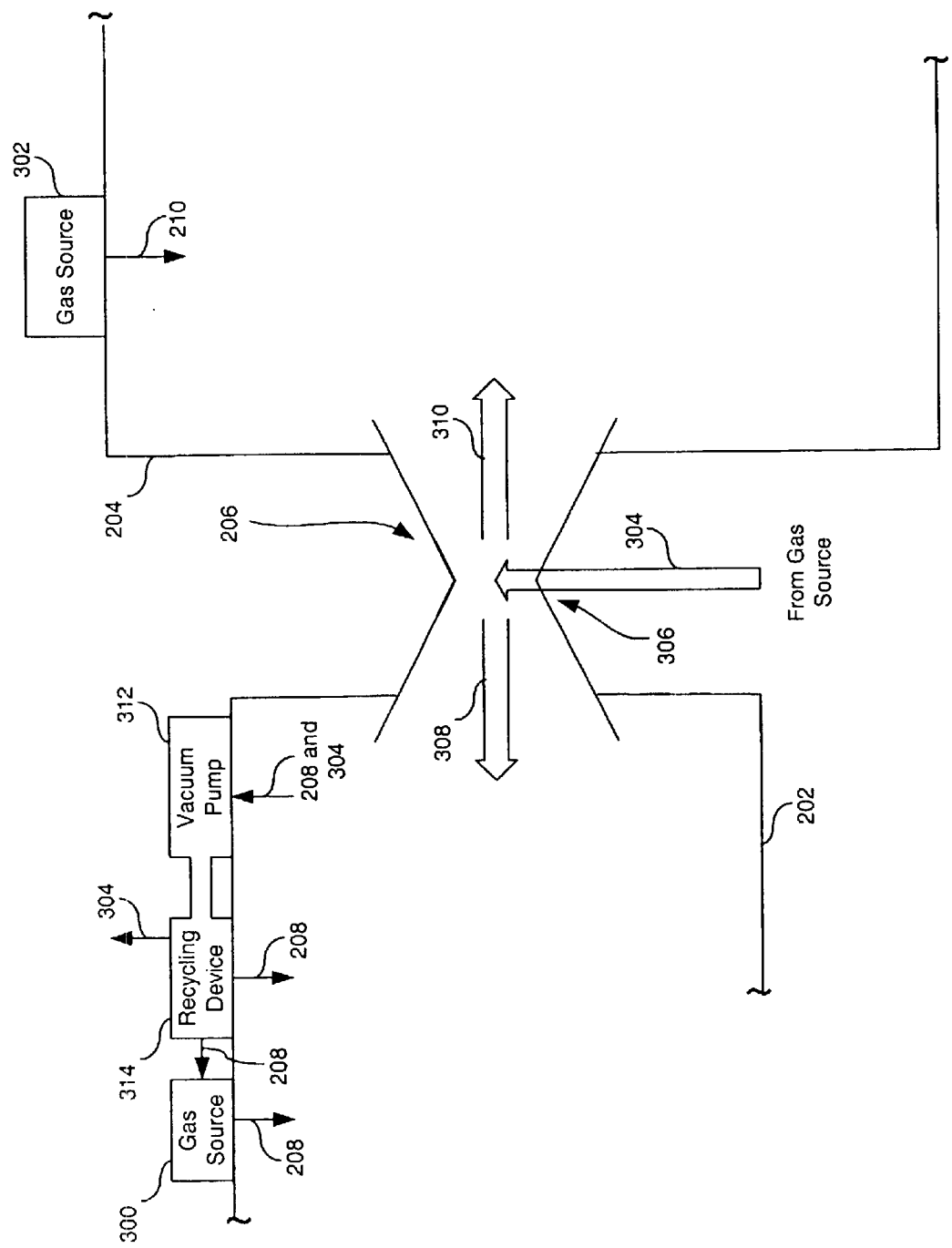
FIG. 3 shows gas flow through a gaslock in the lithographic system of FIG. 2.

FIG. 3 illustrates an interaction of gases in gas lock 206 according to embodiments of the present invention. First and second gases 208 and 210 are supplied to first and second chambers 202 and 204 via first and second gas sources 300 and 302. A third gas 304 (e.g., helium, neon, nitrogen, etc.) is passed through an inlet 306 in gas lock 206 from a gas source (not shown). In an embodiment, third gas 304 can be continuously passed through an inlet in gas lock 206. Third gas 304 should be chosen so that it is easily stripped out of first gas 208 during a recycling device stage (e.g., a purifying and recycling stage), as discussed below. By purifying and recycling first gas 208, system 200 of the present invention reduces costs over conventional systems that must discard the first gas 208 after its initial use because it mixes with second gas 210. The discarding of first gas 208 makes up substantial amount of the running expense of the tool.

The flow of third gas 304 forces molecules of first gas 208 to travel in a direction of arrow 308. Similarly, the flow of third gas 304 forces molecules of second gas 210 to travel in a direction of arrow 310. Thus, the flow of third gas 304 isolates first gas 208 from the second gas 210. In an embodiment, first gas 208 and third gas 304 are pumped from first chamber 202 using a pump (e.g., a vacuum pump) 312. Then, first gas 208 is separated from third gas 304 in recycling device 314, such that first gas 208 can be reused to form the emitted light. For example, third gas 304 can be chosen to have a freezing point (e.g., −60° C.), which is substantially above a freezing point (e.g., −200° C.) of first gas 208. Then, third gas 304 is frozen, separated from first gas 208, and removed from recycling device 314. In various embodiments, first gas 208 can either be reused directly from recycling device 314 or transmitted to gas source 300.

It is to be appreciated that in various embodiments third gas 304 can be reused after exiting recycling device 314 or it can be discarded. It is also to be appreciated that although pump 312 and recycling device 314 are shown coupled directly to a top of first chamber 202, either one or both of pump 312 and recycling device 314 can be indirectly coupled to first chamber 202 and/or they can be positioned anywhere with respect to first chamber 202. Also, although not shown, it is to be appreciated that second gas 210 can also be recycled using similar or functionally similar devices, as is known in the art.

Figure 4:
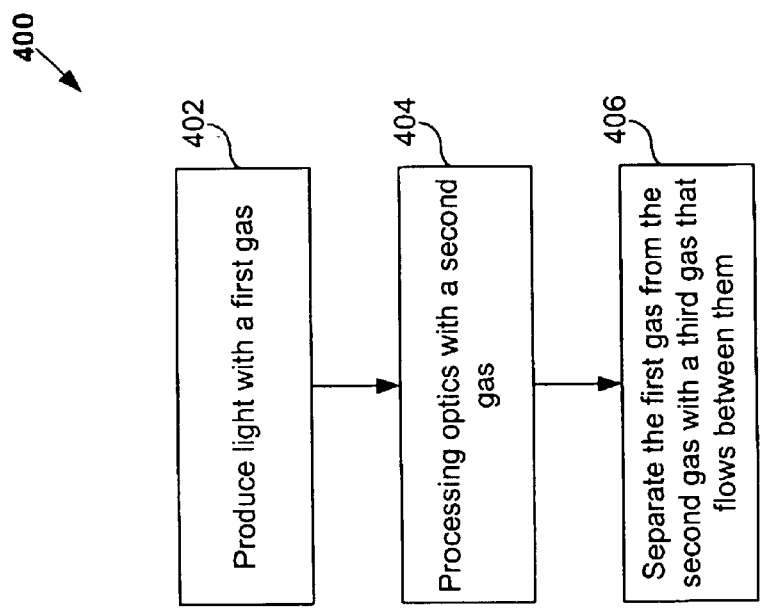
FIG. 4 shows a flowchart depicting a method according to an embodiment of the present invention.

FIG. 4 shows a flowchart depicting a method 400 according to an embodiment of the present invention. At step 402, light (e.g., extreme ultraviolet light) is produced with a first gas (e.g., xenon, lithium vapor, tin, krypton, and water vapor). At step 404, optics are processed with a second gas (e.g., helium, argon, hydrogen, and nitrogen). At step 404, the first gas is separated (e.g., isolated) from the second gas with a third gas (e.g., helium, neon, and nitrogen, that flows between them.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system comprising:
   a first chamber including an element that emits light based on a first gas;
   a second chamber that uses the emitted light to perform a process and that includes a second gas;
   a gaslock that receives within the gas lock the first gas and the second gas and that couples the first chamber to the second chamber; and
   a gas source that supplies a third gas between the first and the second gas inside the gaslock, such that the first gas is isolated from the second gas inside the gaslock.

2. The system of claim 1, wherein said first gas is selected from the group consisting of xenon, lithium vapor, tin, krypton, and water vapor.

3. The system of claim 1, wherein said second gas is selected from the group consisting of helium, argon, hydrogen, and nitrogen.

4. The system of claim 1, wherein said third gas is selected from the group consisting of helium, neon, and nitrogen.

5. The system of claim 1, further comprising:
   a pump that pumps the first and third gas from the first chamber; and
   a recycling device that separates the first gas from the third gas, such that the first gas is reused to form the emitted light.

6. The system of claim 5, wherein the pump and the recycling device are positioned outside the first chamber.

7. The system of claim 1, wherein the element emits extreme ultra violet light.

8. The system of claim 1, wherein the first chamber houses a plasma light source.

9. The system of claim 8, wherein the plasma light source produces extreme ultra violet light.

10. A system, comprising:
    a light source chamber having a first gas;
    an optics chamber having a second gas;
    a first means for coupling said light source chamber to said optics chamber, the first means receiving the first gas and the second gas therein; and
    a second means for passing a third gas through said first means to isolate said first gas from said second gas.

11. The system of claim 10, wherein said first gas is selected from the group consisting of xenon, lithium vapor, tin, krypton, and water vapor.

12. The system of claim 10, wherein said second gas is selected from the group consisting of helium, argon, hydrogen, and nitrogen.

13. The system of claim 10, wherein said third gas is selected from the group consisting of helium, neon, and nitrogen.

14. The system of claim 10, further comprising:
    a pump that pumps the first and third gas from the first chamber, and
    a recycling device that separates the first gas from the third gas, such that the first gas is reused to form the emitted light.

15. The system of claim 14, wherein the pump and the recycling device are positioned outside the first chamber.

16. The system of claim 10, wherein the first chamber emits extreme ultra violet light.

17. The system of claim 10, wherein the first chamber houses a plasma light source.

18. The system of claim 17, wherein the plasma light source produces extreme ultra violet light.

19. A method comprising:
    (a) producing light with a first gas;
    (b) processing optics with a second gas;
    (c) receiving the first and second gas inside a gaslock; and
    (d) separating the first gas from the second gas inside the gaslock with a third gas that flows between them.

20. The method of claim 19 comprising, wherein said first gas is selected from the group consisting of xenon, lithium vapor, tin, krypton, and water vapor.

21. The method of claim 19, wherein said second gas is selected from the group consisting of helium, argon, hydrogen, and nitrogen.

22. The method of claim 19, wherein said third gas is selected from the group consisting of helium, neon, and nitrogen.

23. The method of claim 19, further comprising separating the first gas from the third gas and recycling the first gas.

24. The method of claim 19, wherein said producing step (a) produces extreme ultra violet light.

25. The method of claim 19, wherein said processing step (b) reduces contamination in an optics chamber.

26. The method of claim 19, wherein said processing step (b) protects optics in an optics chamber.

* * * * *